(12) United States Patent
Suzuki et al.

(10) Patent No.: US 10,770,301 B2
(45) Date of Patent: Sep. 8, 2020

(54) PLANARIZATION PROCESSING DEVICE

(71) Applicant: TOHO ENGINEERING CO., LTD., Yokkaichi-shi (JP)

(72) Inventors: Tatsutoshi Suzuki, Yokkaichi (JP); Eisuke Suzuki, Yokkaichi (JP); Daisuke Suzuki, Yokkaichi (JP)

(73) Assignee: TOHO ENGINEERING CO., LTD., Yokkaichi-Shi (JP)

( * ) Notice: Subject to any disclaimer, the term of this patent is extended or adjusted under 35 U.S.C. 154(b) by 306 days.

(21) Appl. No.: 15/751,699

(22) PCT Filed: Mar. 10, 2017

(86) PCT No.: PCT/JP2017/009672
§ 371 (c)(1),
(2) Date: Feb. 9, 2018

(87) PCT Pub. No.: WO2017/155081
PCT Pub. Date: Sep. 14, 2017

(65) Prior Publication Data
US 2018/0277380 A1    Sep. 27, 2018

(30) Foreign Application Priority Data

Mar. 11, 2016 (JP) ................................. 2016-048108

(51) Int. Cl.
*H01L 21/306* (2006.01)
*H01L 21/321* (2006.01)
(Continued)

(52) U.S. Cl.
CPC .......... *H01L 21/30625* (2013.01); *B24B 1/00* (2013.01); *B24B 1/04* (2013.01);
(Continued)

(58) Field of Classification Search
None
See application file for complete search history.

(56) References Cited

U.S. PATENT DOCUMENTS 5,245,790 A  9/1993 Jerbic
5,630,748 A  5/1997 Guenin
(Continued)

FOREIGN PATENT DOCUMENTS

DE  69314335       11/1997
JP  H0621029 A    1/1994
(Continued)

OTHER PUBLICATIONS

Bui Van Pho et al., High-Resolution TEM Observation of 4H-SiC (0001) Surface Planarized by Catalyst-Referred Etching, Materials Science Forum, vols. 717-720, pp. 873-876 (May 2012).
(Continued)

*Primary Examiner* — Sylvia MacArthur
(74) *Attorney, Agent, or Firm* — J-TEK Law PLLC; Jeffrey D. Tekanic; Scott T. Wakeman

(57) ABSTRACT

A planarization processing device for polishing a substrate, e.g., a semiconductor wafer, includes two planarization processing sections (SP1, SP2) that each include a holder (62) for holding a workpiece (W), a drive motor (71) that rotates the holder (62), a support plate (4) holds a pad (5), a linear guide (3) that guides reciprocal movement of the support plate (4) in a direction parallel to the surface of the pad (5), and a drive cylinder (72) that advances the holder (62) or the support plate (4) in a direction that intersects the surface of the workpiece W or the pad (5) to cause the opposing surfaces of the workpiece and the pad (5) to be at least proximal to each other. A primary driver (PD) causes
(Continued)

the support plates (4) of the planarization processing sections (SP1, SP2) to reciprocate along the same straight line in opposite phases.

21 Claims, 5 Drawing Sheets

(51) Int. Cl.
| | |
|---|---|
| B24B 37/07 | (2012.01) |
| B24B 1/04 | (2006.01) |
| B24B 37/34 | (2012.01) |
| B24B 1/00 | (2006.01) |
| B24B 41/00 | (2006.01) |

(52) U.S. Cl.
CPC .............. *B24B 37/07* (2013.01); *B24B 37/34* (2013.01); *B24B 41/007* (2013.01); *H01L 21/306* (2013.01); *H01L 21/32115* (2013.01)

(56) References Cited

U.S. PATENT DOCUMENTS

| | | | |
|---|---|---|---|
| 5,934,979 | A | 8/1999 | Talieh |
| 6,517,667 | B1 | 2/2003 | Nakayoshi |
| 6,527,625 | B1 | 3/2003 | Kajiwara et al. |
| 6,540,590 | B1 | 4/2003 | Kajiwara et al. |
| 6,719,618 | B2 | 4/2004 | Homma et al. |
| 6,881,134 | B2 | 4/2005 | Brown |
| 10,199,242 | B2 | 2/2019 | Suzuki et al. |
| 2001/0010305 | A1 | 8/2001 | Takahashi |
| 2001/0016470 | A1 | 8/2001 | Nobe |
| 2002/0173223 | A1 | 11/2002 | Gitis et al. |
| 2003/0119425 | A1 | 6/2003 | Suzuki |
| 2004/0198056 | A1 | 10/2004 | Suzuki |
| 2004/0198199 | A1 | 10/2004 | Suzuki |
| 2004/0198204 | A1 | 10/2004 | Suzuki |
| 2004/0209551 | A1 | 10/2004 | Suzuki |
| 2006/0137170 | A1 | 6/2006 | Suzuki |
| 2006/0154577 | A1 | 7/2006 | Suzuki |
| 2007/0020918 | A1* | 1/2007 | Hirokawa ................ B23H 5/08 438/626 |
| 2007/0032182 | A1 | 2/2007 | Suzuki |
| 2008/0064311 | A1 | 3/2008 | Suzuki |
| 2008/0073222 | A1 | 3/2008 | Yamauchi et al. |
| 2010/0147463 | A1 | 6/2010 | Yamauchi et al. |
| 2010/0176089 | A1 | 7/2010 | Delamarche et al. |
| 2011/0319000 | A1 | 12/2011 | Suzuki et al. |
| 2012/0003903 | A1 | 1/2012 | Suzuki et al. |
| 2012/0244649 | A1 | 9/2012 | Sano et al. |
| 2013/0029566 | A1 | 1/2013 | Suzuki et al. |
| 2013/0288577 | A1 | 10/2013 | Chen et al. |
| 2014/0051249 | A1 | 2/2014 | Suzuki et al. |
| 2014/0113533 | A1 | 4/2014 | Fung et al. |
| 2016/0167193 | A1 | 6/2016 | Eryu et al. |
| 2017/0047237 | A1 | 2/2017 | Kobata et al. |
| 2017/0069506 | A1 | 3/2017 | Yamauchi et al. |
| 2017/0098559 | A1 | 4/2017 | Suzuki et al. |
| 2017/0291278 | A1* | 10/2017 | Lee ........................ B24B 37/04 |
| 2018/0277380 | A1* | 9/2018 | Suzuki .............. H01L 21/30625 |

FOREIGN PATENT DOCUMENTS

| | | |
|---|---|---|
| JP | 2002283226 A | 10/2002 |
| JP | 2004017229 | 1/2004 |
| JP | 2004223636 A | 8/2004 |
| JP | 2006114632 A | 4/2006 |
| JP | 2007283410 A | 11/2007 |
| JP | 2008049430 A | 3/2008 |
| JP | 2008081389 A | 4/2008 |
| JP | 2008121099 A | 5/2008 |
| JP | 2008136983 A | 6/2008 |
| JP | 2009117782 A | 5/2009 |
| JP | 2009184088 A | 8/2009 |
| JP | 2010205796 A | 9/2010 |
| JP | 2012064972 A | 3/2012 |
| JP | 2012235072 A | 11/2012 |
| JP | 2013255961 A | 12/2013 |
| JP | 2014038981 A | 2/2014 |
| JP | 2015514599 A | 5/2015 |
| WO | 2015159973 A1 | 10/2015 |

OTHER PUBLICATIONS

English translation of the International Search Report dated Sep. 14, 2017 for parent application No. PCT/JP2017/009672.
English translation of the Written Opinion for parent application No. PCT/JP2017/009672.
Hideyuki Hara, et al., (2007) Catalyst-referred etching of silicon, Science and Technology of Advanced Materials, 8:3, 162-165, DOI: 10.1016/j.stam.2006.12.004.
Yasuhisa Sano et al., "Abrasive-Free Polishing of SiC Wafer Utilizing Catalyst Surface Reaction"; Abstract #1952, 224th ECS Meeting, 2013.
Communication from the EPO dated Apr. 8, 2019 in counterpart EP application No. 17 763 421.9, including European Search Opinion, European Search Report and examined claims 1-12.
Office Action from the Japanese Patent Office dispatched Jan. 24, 2017 in related Japanese application No. 2016-048108, and machine translation thereof.

* cited by examiner

PLANARIZATION PROCESSING DEVICE

CROSS-REFERENCE

This application is the US national stage of International Patent Application No. PCT/JP2017/009672 filed on Mar. 10, 2017, which claims priority to Japanese Patent Application No. 2016-048108 filed on Mar. 11, 2016.

TECHNICAL FIELD

The present invention relates to a planarization processing device, and particularly to a device suitably usable for planarization processing using a catalyst-aided chemical processing method. It is, however, noted that the present invention is also applicable to a planarization processing device that does not necessarily use a catalyst-aided chemical processing method.

BACKGROUND ART

In Patent Literature 1 and Patent Literature 2, catalyst-aided chemical processing methods are disclosed. Catalyst-aided chemical processing methods include using a catalyst made of a transition metal on a processing reference surface, placing a workpiece in a solution that does not contain abrasive grains or the like, bringing the processing reference surface into contact with or proximal to the processed surface of the workpiece, causing the processing reference surface and the processed surface to move relative to each other, producing compounds in a chemical reaction between active species generated from the solution and surface atoms of the workpiece, and removing the compounds to process (etch) the workpiece; it is thereby possible perform planarization processing of a surface of difficult-to-process substrates made, for example, of SiC and GaN with high precision approximately at an atomic level.

Incidentally, as a device that planarizes by reciprocally moving the surface (processed surface) of the pad, which is formed of a transition metal layer that serves as the catalyst layer, and the surface of the processed substrate (processed surface), which serves as the workpiece, a large-diameter circular pad is rotated on a platen, and is brought into contact or proximity with the surface of the processed substrate, which has a smaller diameter and is held by a rotating holder, as shown conventionally in Patent Literature 1.

CITATION LIST

Patent Literature

Patent Literature 1: Japanese Patent Laid-Open No. 2006-114632
Patent Literature 2: Japanese Patent Laid-Open No. 2007-283410

SUMMARY OF THE INVENTION

Problems to be Solved by the Invention

In the processing devices of the related art, however, the apparatus is large because the diameter of the pad is at least twice the diameter of the workpiece, and an economical processing is not achieved because it takes a long period of time to process SiC and GaN substrates. Further, although the processed substrate is rotated while being pressed against the pad surface by the back pressure of an airbag provided in the holder, the processed substrate is pulled towards the pad surface by the so-called water-adhesion effect resulting from the solution that is supplied between the processed substrate and the pad having the catalyst layer of Pt or the like formed on the surface and that is a smooth flat surface; therefore, a large circumferential rotary force of the pad acts on the processed substrate, pulls the processed substrate away from the holder, and hurls it toward the outer circumference of the pad, resulting in a risk of damage by it being caught, etc., on an outwardly-located retainer. Thus, this decreased yields and has led to an increase in processing costs. Therefore, the present inventors previously proposed a new planarization processing device to solve the problems described above (PCT/JP2015/86493).

Incidentally, with the previously-proposed new catalyst-aided chemical processing device, another problem to be solved arose. That is, to improve the processing rate and averaging, it was desired to move a support plate, on which a container that accommodates the pad is placed, at a high speed, but vibrations caused by vibration-causing forces owing to reaction forces produced when the support plate is being moved occurred in the related art. If vibrations occur, it is necessary to reduce the vibration-causing forces because they affect the processed surface. The vibration-causing forces desired to be reduced are the vibration-causing forces that are produced when one of the workpiece and a catalyst body having a catalyst layer at least on the surface of the catalyst body is moved and results in upward/downward vibration that strikes the workpiece; as an example, the vibration-causing forces are vibration-causing forces that vibrate the device main body to cause upward/downward oscillating motion of the surface where the workpiece is caused to be in proximity to or in contact with the catalyst.

It is therefore an object of the present invention to provide a planarization processing device that can effectively suppress the generation of vibrations during operation of the device.

Means for Solving the Problems

To achieve the object described above, in a first invention, a planarization processing device comprises a planarization processing section (SP1) that includes a first holding means (62) that holds one of a workpiece (W) and a catalyst body (5) having a catalyst layer at least on a surface thereof, a second holding means (4) that holds the other of the workpiece (W) and the catalyst body (5) and brings the surface thereof into contact with or proximal to a surface of the one of the workpiece (W) and the catalyst body (5), and a guide member (3) that causes the second holding means (4) to move in a direction parallel to the other surface of the workpiece (W) or the catalyst body (5) at least by an amount that makes possible planarization based on a catalytic reaction; at least one weight section; and a primary driver (PD) that moves the second holding means (4) of the planarization processing section (SP1) and the weight section in such a way that vibration-causing forces arising from reaction forces during movement thereof are attenuated overall. It is noted that the movement in this case may be a single movement in one direction, a single reciprocating movement, or a repetitive reciprocating motion. In addition, the catalyst body is not limited to typical pads; its structure is not limited and may be a component carrying a catalyst or may be solely a catalyst. Furthermore, the holding of the workpiece and the catalyst body is not particularly limited; the rear surface, the side surface, the front surface, or any other portion of the workpiece and the catalyst body may be held. The workpiece is, of course, not limited to a plate-shaped object.

The "amount that makes possible planarization based on a catalytic reaction" is an amount of travel corresponding to at least several atoms that brings about averaging based on the catalytic reaction. The "travel that makes possible planarization based on a catalytic reaction" changes in accordance with the combination of the catalyst body and the workpiece. The reason for this is that the catalyst-aided chemical processing requires movement corresponding to at least several atoms that brings about averaging based on the catalytic reaction. To achieve optimum averaging, it is preferable, instead of the minimum travel, to cause a large number of new atomic surfaces of the catalyst body to be in contact with or proximal to a specific point of the workpiece. The reason for this is that, unless the surface of the catalyst body is formed as an ideally flat surface at the atomic level, the surface of the catalyst body will have at least atomic-level or greater waviness, warpage, and surface roughness. When the catalyst body has waviness, warpage, and surface roughness, too small a travel of the catalyst body undesirably transfers the waviness, warpage, and roughness of the catalyst body to the catalyst-contact surface of the workpiece; it is therefore preferable for the averaging to employ a long travel of the catalyst body or the workpiece. The processing of the present invention therefore requires movement of the catalyst body or the workpiece by a distance corresponding to at least several atoms that brings about averaging based on the catalytic reaction. Specific numerical values depend on the states of the workpiece and the material of the catalyst body. With respect to specific points of the workpiece, a large number of surfaces of the catalyst body functioning for the averaging preferably affect the averaging.

In the first invention, precise planarization processing without causing damage to the workpiece is possible using a compact equipment. In addition to this, since the vibration-causing forces arising from the reaction forces produced by the movement of the second holding means of the planarization processing section are reduced as a whole, planarization processing failure caused by large vibrations of the device due to the vibration-causing forces acting on each portion of the device is eliminated.

In a second invention, a planarization processing device comprises a planarization processing section (SP1) that includes first holding means (62) that holds one of a workpiece (W) and a catalyst body (5) having a catalyst layer at least on a surface thereof, a first drive means (71) that rotates the first holding means (62) about a rotational axis that intersects the surface of the one of the workpiece (W) and the catalyst body (5), a second holding means (4) that holds the other of the workpiece (W) and the catalyst body (5) and brings the surface thereof into contact with or proximal to the surface of the one of the workpiece (W) and the catalyst body (5), and a guide member (3) that causes the second holding means (4) to move in a direction parallel to the other surface of the workpiece (W) or the catalyst body (5) at least by an amount that makes possible planarization based on a catalytic reaction; at least one weight section; and a primary driver (PD) that moves the second holding means (4) of the planarization processing section (SP1) and the weight section in such a way that vibration-causing forces arising from reaction forces during movement thereof are attenuated overall.

In the second invention, in addition to the advantageous effects provided by the first invention, the planarization can be efficiently performed by providing the first drive means.

In a third invention, a planarization processing device comprises a planarization processing section (SP1) that includes a first holding means (62) that holds one of a workpiece (W) and a catalyst body (5) having a catalyst layer at least on a surface thereof, a first drive means (71) that rotates the first holding means (62) about a rotational axis that intersects the surface of the one of the workpiece (W) and the catalyst body (5), a second holding means (4) that holds the other of the workpiece (W) and the catalyst body (5) and brings the surface thereof to face the surface of the one of the workpiece (W) and the catalyst body (5), a guide member (3) that causes the second holding means (4) to reciprocally move in a direction parallel to the other surface of the workpiece (W) or the catalyst body (5) at least by an amount that makes possible planarization based on a catalytic reaction, and a second drive means (72) that advances the first holding means (62) or the second holding means (4) in the direction that intersects the surface of the workpiece (W) or the catalyst body (5) and causes the surface of the workpiece (W) and the surface of the catalyst body (5) to be in contact with or in proximity with each other; at least one weight section; and a primary driver (PD) that moves the second holding means (4) of the planarization processing section (SP1) and the weight section in such a way that vibration-causing forces arising from reaction forces during movement thereof are attenuated overall.

In the third invention, in addition to the advantageous effects provided by the first invention, fine adjustments of the contact or proximity between the surface of the workpiece and the surface of the catalyst body can be readily made by providing the second drive means.

In a fourth invention, two or more of the second holding means and the weight section are arranged at intervals in a circumferential direction around a shaft body of the primary driver, and the primary driver causes the second holding means and the weight sections to simultaneously reciprocate inward and outward.

In a fifth invention, the primary driver moves the second holding means and the weight section in a single plane in opposite phases in opposite directions.

In the fifth invention, since the second holding means of the planarization processing section and the weight section are moved in the same plane in opposite phases in opposite directions, vibration-causing forces arising from the movements are reduced; as a result, the problem of vibration of the device owing to vibration-causing forces acting on each portion of the device is effectively eliminated.

In a sixth invention, the primary driver (PD) moves the second holding means (4) and the weight section along a single straight line in opposite phases in opposite directions. In the sixth invention, the planarization processing section and the weight section are provided on opposite sides or the left and right sides of the primary driver, and this configuration includes a configuration in which the planarization processing section and the weight section are provided along a plurality of radial straight lines extending from the center of the primary driver.

In the sixth invention, since the second holding means of the planarization processing section and the weight section are moved along the same straight line in opposite phases in opposite directions, vibration-causing forces arising from the movements are reduced. As a result, the problem of vibration of the device owing to vibration-causing forces acting on each portion of the device is effectively eliminated.

In this case, the vibration-causing forces are reduced to approximately zero by configuring the weight section and the planarization processing section to have substantially the same weight.

In a seventh invention, the weight section is another planarization processing section having a planarization processing function. The other planarization processing section in this case may be a planarization processing section based on the same principle of the planarization processing section described in the first to third inventions or may be a planarization processing section based on another planarization principle.

In the seventh invention, the planarization processing of the workpiece can be efficiently performed by providing the plurality of planarization processing sections and reduces the vibration-causing forces arising from the movements as a whole at the same time. As a result, the problem of vibration of the device owing to vibration-causing forces acting on each portion of the device is eliminated.

In an eighth invention, the primary driver (PD) includes a drive motor (82) and a pair of shaft sections (93, 94) that are provided at symmetric positions spaced from each other by the same amount in a radial direction from an axis of an output shaft (C) of the drive motor (82) and rotationally move in accordance with rotation of the output shaft (C); the second holding means (4) and the weight section are respectively caused to reciprocate in synchrony with the pair of shaft sections (93, 94).

Another aspect of the invention comprises a planarization processing system that includes a first planarization processing unit, which includes a first holding means that holds one of a workpiece and a catalyst body having a catalyst layer at least on a surface thereof and a second holding means that holds the other of the workpiece and the catalyst body and brings the surface thereof into contact with or proximal to a surface of the one of the workpiece and the catalyst body. The planarization processing system also includes a guide, along which the second holding means is movable in a direction parallel to the other surface of the workpiece or the catalyst body at least by an amount that makes possible planarization based on a catalytic reaction and a primary driver that moves the second holding means along the guide to planarize the workpiece. The planarization processing system also includes a counterweight operably connected to the primary driver that is movable by the primary driver in a manner that counteracts reaction forces produced by the movement of the second holding means in such a way that vibrations caused by the movement of the second holding means are attenuated.

The reference numerals in parentheses in the preceding paragraph provide, solely for reference purposes, a representative, non-limiting correspondence of means plus function features with specific embodiments or structures that will be further described in the following.

As described above, according to the planarization processing device of the present invention, the compact device allows precise planarization processing of a workpiece without damage thereof and effectively suppresses occurrence of vibration during operation of the device.

DETAILED DESCRIPTION

It is noted that the embodiments described below are merely examples, and a variety of design improvements, which a person skilled in the art makes within a range that does not depart from the gist of the present invention, also fall within the scope of the present invention.

Figure 1:
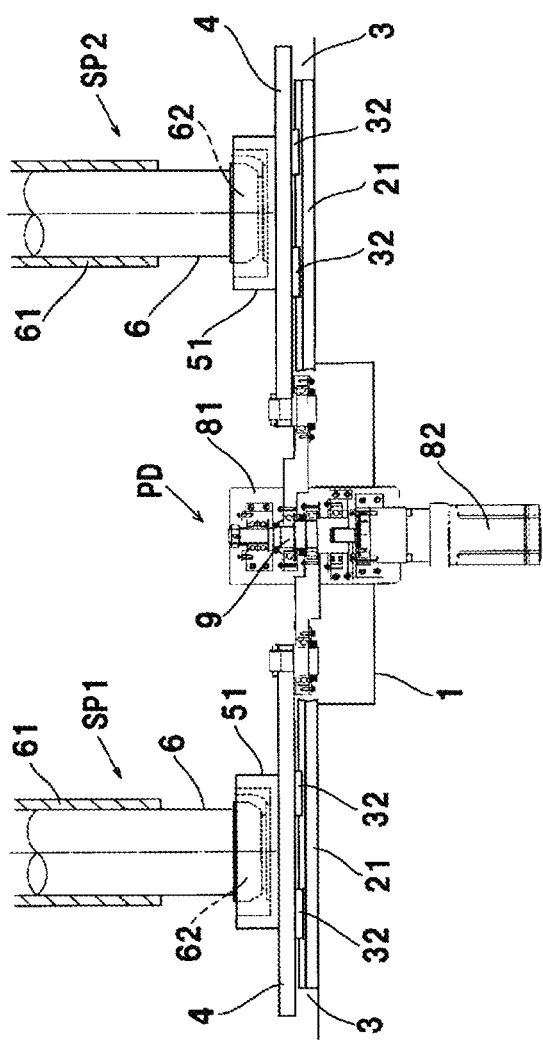
FIG. 1 is a partial cross-sectional, overall side view of a planarization processing device showing an embodiment of the present invention.

FIG. 1 is a partial cross-sectional, overall side view of a planarization processing device. The planarization processing device includes a pair of planarization processing sections SP1 and SP2 on the left and right sides of a base 1. The left and right planarization processing sections SP1, SP2 have the same structure and the same weight. The planarization processing section SP1 will be described below in detail with reference to FIG. 2.

Figure 2:
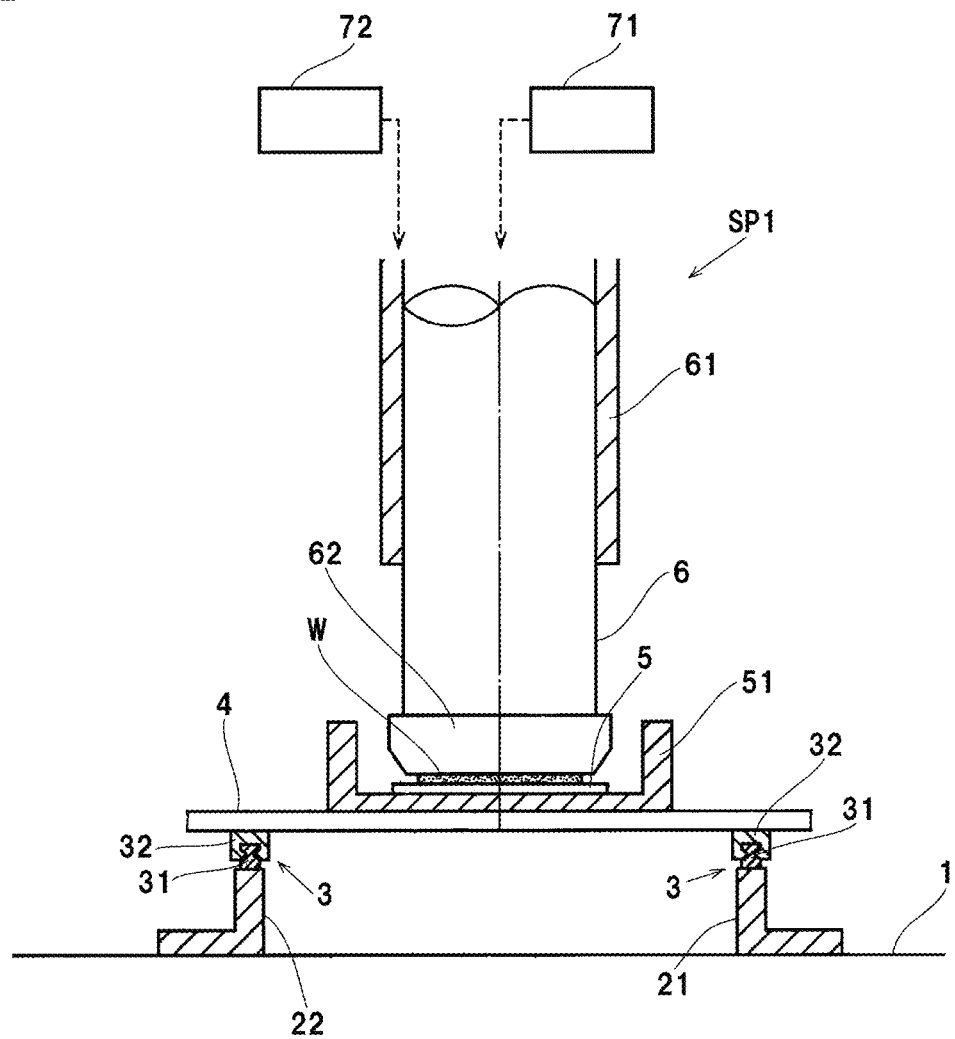
FIG. 2 is a vertical cross-sectional view showing a planarization processing section in detail.

In FIG. 2, stands 21 and 22, which have symmetric letter-L-shaped cross sections, are disposed on the base 1 in parallel to each other and extend in the frontward/rearward direction in FIG. 1 (rightward/leftward direction in FIG. 1). The stands 21 and 22 are each a continuous single-piece stand on the left and right planarization processing sections SP1, SP2 and positioned along a single straight line; rails 31, each of which forms a linear guide 3, which is a guide member, are fixed to the left and right stands 21, 22 so as to extend therealong. Each of the rails 31 is provided with sliders 32, which are slidably movable along the rail 31, at two locations in the longitudinal direction thereof; a rectangular support plate 4 serving as a second holding means is placed on the right-left, front-rear sliders 32. The support plate 4 is therefore linearly reciprocally movable along the rails 31. The stands 21 and 22 do not necessarily have a letter-L-shaped cross section and each only need to have a surface on which the rail is placed, such as a flat bar. The guide member need not necessarily have the structure described above, and the guide member may, for example, captively-hold a guide shaft and slide along the guide shaft. The support plate 4 is not particularly required to have a rectangular shape.

A circular container 51, which stores liquid and opens upward, is placed on a central portion of the upper surface of the support plate 4. A pad 5, which is an example of a catalyst body and has a catalyst layer with a predetermined thickness formed by a sputtering process or the like on the entire surface of the catalyst body, is provided on the inner bottom surface of the container 51. Rubber or urethane or the like, which is resistant to the processing solution, is used as the material of the pad 5. A transition metal, such as Pt, can be used as the catalyst. The diameter of the pad 5 may be set so as to be at least slightly greater than the outer diameter of a processed substrate W, which is an example of a workpiece. The container 51 is not particularly required to have a circular shape. The container 51 may be a container that stores a gas.

A spindle 6, which has a circular cross-sectional shape, is provided above the container 51 so as to be vertically oriented and is held by a sleeve 61 so as to be rotatable in the vertical orientation. The spindle 6 is rotated by a drive motor 71 (FIG. 2) serving as a first drive means. The sleeve 61 is lifted and lowered by a drive cylinder 72 serving as a second drive means, and the spindle 6 is caused to move frontward and rearward relative to the pad 5 or approach and move away from the pad 5 in accordance with the motion of the sleeve 61. A known holder 62 serving as a first holding means is provided at the lower end of the spindle 6, and the processed substrate W is held below the lower surface of the holder 62. The spindle 6, the drive motor 71, the drive cylinder 72, and other components are provided on the base 1 or thereabove.

Figure 3:
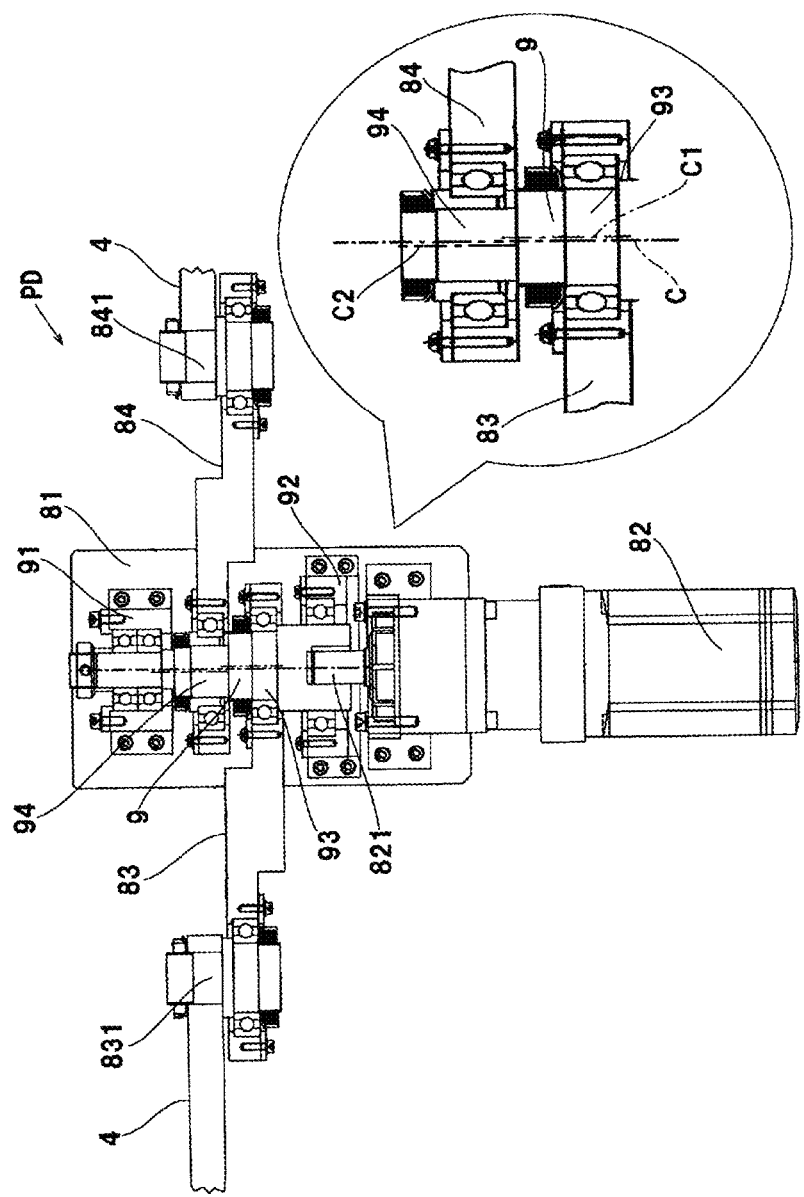
FIG. 3 is a cross-sectional view of a primary driver.

In FIG. 1, a primary driver PD is provided in between the left and right planarization processing sections SP1, SP2. FIG. 3 shows the primary driver PD in detail. The primary driver PD includes a bracket plate 81, which is provided in a vertical orientation with respect to the base 1; a shaft body 9, which extends in the upward/downward direction in the bracket plate 81, is rotatably held by bearing members 91 and (see FIG. 3). An output shaft 821 of a drive motor 82, which is provided in the upward/downward direction along the bracket plate 81, enters into and is coupled to a central portion of the lower end of the shaft body 9.

One end portion of each of a pair of linkage plates 83 and 84, which horizontally extend in the left-right direction, is pivotally linked to the outer circumference of a middle portion of the shaft body 9. The linkage plate 83, which is linked to a lower portion of the shaft body 9, is bent upward at a middle position thereof, and the other end portion of the linkage plate 83 is pivotally linked via a linkage shaft 831 to the support plate 4 in the planarization processing section SP1 (see FIG. 1). On the other hand, the linkage plate 84, which is linked to an upper portion of the shaft body 9, is bent downward at a middle position thereof, and the other end portion of the linkage plate 84 is pivotally linked via a linkage shaft 841 to the support plate 4 in the planarization processing section SP2. The upper surfaces of the support plates 4 in the planarization processing sections SP1 and SP2 are flush with each other in a horizontal plane.

The aforementioned middle portion of the shaft body 9 is configured so that the axes C1 and C2 of shaft sections 93 and 94, to which the linkage plates 83 and 84 are linked, are eccentric from the axis C of the shaft body 9 (axis of the output shaft 821 of the drive motor 82), as shown in the enlarged view in FIG. 3. That is, the axis C1 of the shaft section 93, to which the linkage plate 83 is linked, and the axis C2 of the shaft section 94, to which the linkage plate 84 is linked, are spaced apart from the axis C of the shaft body 9 in the radial direction by the same amount d and are located at 180°-symmetric positions.

Therefore, when the drive motor 82 rotates the shaft body 9 about the axis C thereof, the axes C1 and C2 of the shaft sections 93 and 94 are caused to rotationally move around the axis C of the shaft body 9. In response to the rotational motion, the support plates 4 are caused to reciprocate via the linkage plates 83 and 84 along the same straight line in opposite phases over distance (amplitude) 2d. As an example of the reciprocating motion at this time, 2d is 3 mm and the rotational speed of the shaft body 9 (reciprocating frequency of the support plates 4) is 500 rpm.

When a planarization processing of the lower surface (processed surface) of the processed substrate W is performed using the thus-configured planarization processing device, a liquid necessary for the catalytic reaction, such as HF, HCl, pure water, and another liquid, is filled into the containers 51 on each of the left and right support plates 4, the spindles 6, i.e. the processed substrates W, are rotated by the drive motors 71, and the drive cylinders 72 cause the processed substrates W to be proximal to or in contact with the pads 5 at the same time. In this state, the drive motor 82 causes the support plates 4 and the containers 51 provided thereon to linearly reciprocate in the horizontal direction along the rails 31.

That is, the processed surfaces of the processed substrates W and the pads 5, on which the catalyst layer with which the processed surface comes into contact is formed, are caused to rotate relative to each other and to reciprocate relative to each other at the same time in a plane that intersects the axis of the rotation. The processed surfaces of the processed substrates W thus undergo planarization processing in a catalyst-aided chemical processing with high precision approximately at the atomic level. In this process, since the support plates 4 in the left and right planarization processing sections SP1, SP2 are caused to reciprocate (oscillate) along the same straight line in opposite phases, the vibration of one of the support plates 4 and the vibration of the other cancel each other, whereby the vibration-causing forces acting on the base 1 are sufficiently attenuated and vibration thereof can be prevented.

Here, even if the processed substrate W is suctioned towards the surface of the pad 5 due to the water-adhesion effect, a large circumferential rotary force does not act on the processed substrate, unlike in the conventional art, because the surface of the pad 5 only undergoes a minute reciprocating motion; therefore, there is no problem of the conventional art in which the processed substrate separates from the holder and is caught by the outer retainer, resulting in damage or the like.

Other Embodiments

In the embodiment described above, although the processed substrate is rotated and the pad is caused to undergo a linear reciprocating motion, the processed substrate may be caused to undergo a linear reciprocating motion and the pad may be rotated. In this case, the rotation is not necessarily required, and, further, the reciprocating motion is not necessarily linear motion. Moreover, reciprocating motion is not necessarily employed, and unidirectional motion may be employed.

The reciprocating drive mechanism is not limited to the mechanism in the embodiment described above, and a typical crank mechanism that converts rotary motion produced by a drive motor into linear reciprocating motion can be used. Further, a ball screw mechanism, an attraction/repulsion mechanism based on magnetic force, a cylinder mechanism, and other mechanisms can also be used.

In the embodiment described above, the base may also be caused to reciprocate in the direction parallel to the surface of the base, for example, by using a ball screw mechanism or a cam mechanism. In this case, planarization of a processed substrate is uniformly performed both in a central portion and a peripheral portion of the processed substrate. In addition to the base described above, another base may further be provided below the base described above, and the other base may be caused to reciprocate in the direction parallel to the surface of the base described above, for example, by using a ball screw mechanism or a cam mechanism. Similarly, in addition to the support plates 4, other support plates are provided on the support plates 4, and a mechanism that causes the other support plates to reciprocate in the direction parallel to the plate surfaces of the support plates 4 (in frontward/rearward direction with respect to the plane of view of FIG. 1, for example) may be provided. The workpiece is not limited to a plate-shaped object, such as a substrate. The workpiece only needs to have a shape that allows surface processing. A part that allows catalyst reference etching to be performed is also preferable as the workpiece, because even when a workpiece having such a shape is the subject of planarization processing, and the catalyst reference etching is performed as the catalyst-aided chemical processing, the occurrence of "upward/downward vibration that strikes the workpiece" is problematic. The situation in which the occurrence of "upward/downward vibration that strikes the workpiece" should be avoided is not limited to the case where a plate-shaped workpiece, such as a substrate, is a subject of the processing.

In each of the embodiments described above, although the holders 62 are lifted and lowered, a structure that lifts and lowers the support plates 4 may be employed.

In the embodiment described above, although a pad provided in each of the liquid storing containers is separate therefrom, the pad itself may be formed in the shape of a container so as to store the liquid necessary for the catalytic reaction. The liquid need not necessarily be stored and may be caused to keep flowing through the space between the processed substrate and the pad.

In the embodiment described above, although a drive cylinder is used as the second drive means, the drive cylinder may be replaced with a ball screw mechanism, a robot arm, or any other mechanism.

In the embodiment described above, although a pair of planarization processing sections SP1 and SP2 having the same structure and the same weight are provided, one of the planarization processing sections may be a weight section having the same weight as that of the planarization processing section. The weight section in this case is not necessarily entirely a weight section. For example, part of the parts of the planarization processing section may be removed, and a weight body having the same weight as that of the removed part may be provided. The weight section may still instead be a weight section using a pressuring mechanism. Further, in the embodiment described above, the linkage plates 83 and 84 link the shaft sections 93 and 94 of the shaft body 9 to the support plates 4, but not necessarily. For example, urging members that urge the support plates 4 toward the shaft body may be provided, and one-side ends of the support plates 4 may be caused to be in contact with the outer circumferences of the shaft sections 93 and 94.

In the embodiment described above, although the pair of support plates 4 are caused to reciprocate in opposite directions along the same straight line to cause the vibration-causing forces arising from the reaction forces produced by the motion to be attenuated overall to substantially zero, the support plates 4 (or weight sections) are not necessarily required to be located along the same straight line. For example, three or more support plates (or weight sections) may be arranged at equal angular intervals in the circumferential direction around the shaft body of the primary driver and simultaneously caused to reciprocate inward and outward.

In summary, in case the "upward/downward vibration that strikes the workpiece" described above occurs (in case changes in the position of the center of gravity of the device occur), the weight section only needs to be capable of moving in a direction in which the motion of the weight section cancels entirety or at least a part of the vibration of the device (changes in position of center of gravity) to avoid the occurrence of the upward/downward vibration. In this case, the weight section may be moved in a direction in which the motion of the weight section directly cancels the "upward/downward vibration," which is a target that is desired to be canceled, or in case vibration that causes the "upward/downward vibration" (changes in position of center of gravity of device) is present, the weight section may be moved in a direction in which the motion of the weight section cancels the vibration.

The liquid necessary for the catalyst reaction may be replaced with a gas. Still instead, a liquid and a gas may be used together. In the embodiment described above, the holders 62 and the support plates 4 are disposed so as to face each other in the upward/downward direction and may instead be disposed so as to face each other in the rightward/leftward direction. In case at least a gas or a mist is used in the catalytic reaction, the holders 62 may be provided on the lower side and the support plates 4 may be provided on the upper side, and the positions of configurations necessary for the vertical arrangement may be changed in any of the upward, downward, rightward, and leftward directions to the extent that the changes do not depart from the gist of the present invention. The coupling with the output shaft 821 of the drive motor 82 may instead be a connection using a coupler, a belt, or a gear. The holders 62 may each be for example, grasped using a bite, fastened with screws, sandwiched between jigs, fit into indentations and protrusions or holes, or otherwise structured.

Figure 4:
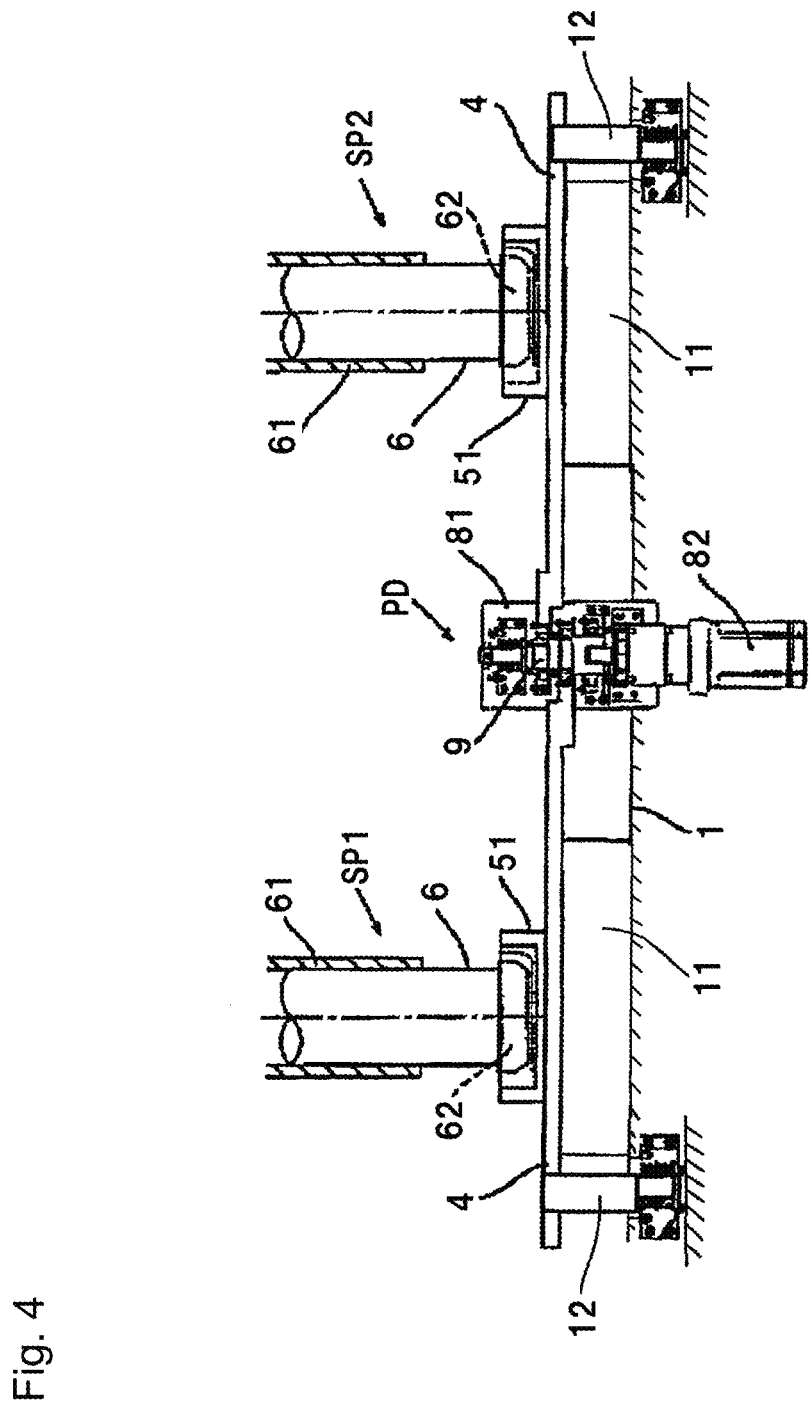
FIG. 4 is a partial cross-sectional, overall side view of a planarization processing device showing an embodiment of the present invention.

In the embodiment described above, although the support plates 4 are caused to reciprocate along the same straight line in the opposite phases, the support plates 4 are not necessarily required to reciprocate along the same straight line. FIG. 4 shows an example of such a case. The reference symbols in FIG. 4 are the same as those in the embodiment that was already described above. In FIG. 4, the inner bent end portions of the support plates 4 are pivotally linked to the eccentric shaft sections 93 and 94 (see FIG. 3) of the shaft body 9. The support plates 4 are placed on slide beds 11 provided on the base 1, and upper end portions of shaft bodies 12, which are eccentric and project in a rotatable manner from the base 1, are slidably and rotatably fit into outer end portions of the support plates 4. According to this structure, the support plates 4 reciprocate in opposite phases over an oval range in the plan view in accordance with the rotation produced by the drive motor 82. As a result, the support plates 4 (that is, pads 5 (see FIG. 2)) move over a wider range than in the embodiment described above, in which the support plates 4 are caused to reciprocate, whereby the range (area) of the surface uniformity of the processed substrate W can be increased.

Figure 5:
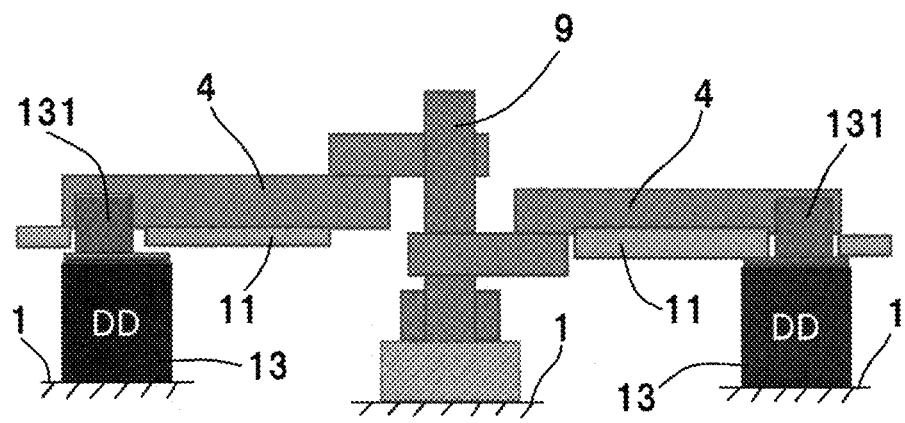
FIG. 5 is a partial cross-sectional, overall side view of a planarization processing device showing an embodiment of the present invention.

FIG. 5 shows another structure that can realize the same function as in FIG. 4. Inner bent end portions of the substrates 4 placed on the slide beds 11 are pivotally linked to the eccentric shaft sections of the shaft body 9 (see shaft sections 93 and 94 in FIG. 3), whereas eccentric shafts 131, each of which is driven and rotated by a motor 13, are slidably and rotatably fit into outer end portions of the substrates 4. The support plates 4 can be caused to reciprocate in opposite phases over an oval range in the plan view by synchronously rotating the shafts of the motors 13. The shaft body 9 may be fixed to the base 1, as shown in FIG. 5, or may be driven and rotated by motors synchronized with the motors 13.

Figure 6:
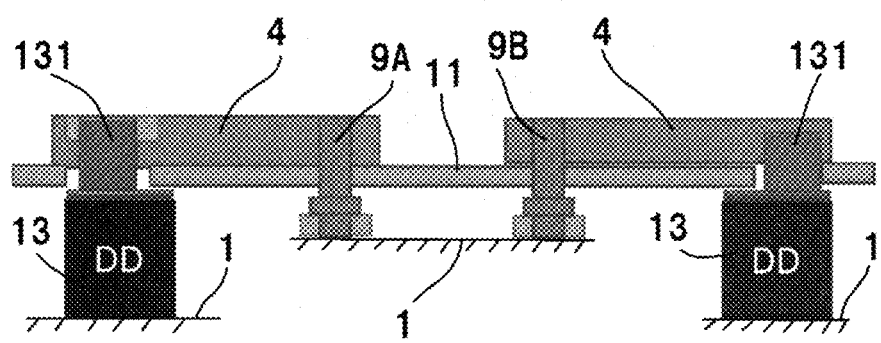
FIG. 6 is a partial cross-sectional, overall side view of a planarization processing device showing an embodiment of the present invention.

FIG. 6 shows still another structure that can realize the same function as in FIG. 4. Inner bent end portions of the substrates 4 placed on a slide bed 11 are pivotally linked to eccentric shaft sections of shaft bodies 9A and 9B (see shaft sections 93 and 94 in FIG. 3), whereas the eccentric shafts 131, which are driven and rotated by the motors 13, are slidably and rotatably fit into the outer end portions of the substrates 4. The support plates 4 can be caused to reciprocate in opposite phases over an oval range in the plan view by synchronously rotating the shafts of the motors 13. The shaft bodies 9A and 9B may be fixed to the base 1, as shown in FIG. 6, or may be driven and rotated by motors synchronized with the motors 13.

According to the embodiments described above, the following operation methods and workpiece manufacturing methods may, of course, be achieved.

A method for operating a planarization processing device including a planarization processing section that includes a first holding means that holds one of a workpiece and a catalyst body having a catalyst layer at least on a surface thereof, a second holding means that holds the other of the workpiece and the catalyst body and brings a surface thereof into contact with or proximal to a surface of the one of the workpiece and the catalyst body, and a guide member that causes the second holding means to move in a direction parallel to another surface of the workpiece or the catalyst body at least by an amount that makes possible planarization based on a catalytic reaction; at least one weight section; and a primary driver that moves the second holding means of the planarization processing section and the weight section in such a way that vibration-causing forces arising from reaction forces during movement thereof are attenuated overall.

A method for operating a planarization processing device including a planarization processing section that includes a first holding means that holds one of a workpiece and a catalyst body having a catalyst layer at least on a surface thereof, a first drive means that rotates the first holding means about a rotational axis that intersects the surface of the one of the workpiece and the catalyst body, a second holding means that holds the other of the workpiece and the catalyst body and brings the surface thereof into contact with or proximal to the surface of the one of the workpiece and the catalyst body, and a guide member that causes the second holding means to move in a direction parallel to another surface of the workpiece or the catalyst body at least by an amount that makes possible planarization based on a catalytic reaction; at least one weight section; and a primary driver that moves the second holding means of the planarization processing section and the weight section in such a way that vibration-causing forces arising from reaction forces during movement thereof are attenuated overall.

A method for operating a planarization processing device including a planarization processing section that includes a first holding means that holds one of a workpiece and a catalyst body having a catalyst layer at least on a surface thereof, a first drive means that rotates the first holding means about a rotational axis that intersects the surface of the one of the workpiece and the catalyst body, a second holding means that holds the other of the workpiece and the catalyst body and causes the surface thereof to face the surface of the one of the workpiece and the catalyst body, a guide member that causes the second holding means to reciprocally move in a direction parallel to another surface of the workpiece or the catalyst body at least by an amount that makes possible planarization based on a catalytic reaction, and a second drive means that advances the first holding means or the second holding means in the direction that intersects the surface of the workpiece or the catalyst body to cause the surface of the catalyst body to be in contact with or proximal to each other; at least one weight section; and a primary driver that moves the second holding means of the planarization processing section and the weight section in such a way that vibration-causing forces arising from reaction forces during movement thereof are attenuated overall.

A workpiece manufacturing method including a planarization processing section that includes a first holding means that holds one of a workpiece and a catalyst body having a catalyst layer at least on a surface thereof, a second holding means that holds the other of the workpiece and the catalyst body and brings a surface thereof into contact with or proximal to a surface of the one of the workpiece and the catalyst body, and a guide member that causes the second holding means to move in a direction parallel to another surface of the workpiece or the catalyst body at least by an amount that makes possible planarization based on a catalytic reaction; at least one weight section; and moving the second holding means of the planarization processing section and the weight section in such a way that vibration-causing forces arising from reaction forces during movement thereof are attenuated overall.

A workpiece manufacturing method including a planarization processing section that includes a first holding means that holds one of a workpiece and a catalyst body having a catalyst layer at least on a surface thereof, a first drive means that rotates the first holding means about a rotational axis that intersects the surface of the one of the workpiece and the catalyst body, a second holding means that holds the other of the workpiece and the catalyst body and brings the surface thereof into contact with or proximal to the surface of the one of the workpiece and the catalyst body, and a guide member that causes the second holding means to move in a direction parallel to another surface of the workpiece or the catalyst body at least by an amount that makes possible planarization based on a catalytic reaction; at least one weight section; and moving the second holding means of the planarization processing section and the weight section in such a way that vibration-causing forces arising from reaction forces during movement thereof are attenuated overall.

A workpiece manufacturing method including a planarization processing section that includes a first holding means that holds one of a workpiece and a catalyst body having a catalyst layer at least on a surface thereof, a first drive means that rotates the first holding means about a rotational axis that intersects the surface of the one of the workpiece and the catalyst body, a second holding means that holds the other of the workpiece and the catalyst body and causes the surface thereof to face the surface of the one of the workpiece and the catalyst body, a guide member that causes the second holding means to reciprocally move in a direction parallel to another surface of the workpiece or the catalyst body at least by an amount that makes possible planarization based on a catalytic reaction, and a second drive means that advances the first holding means or the second holding means in the direction that intersects the surface of the workpiece or the catalyst body to cause the surface of the workpiece and the surface of the catalyst body to be in contact with or proximal to each other; at least one weight section; and moving the second holding means of the planarization processing section and the weight section in such a way that vibration-causing forces arising from reaction forces during movement thereof are attenuated overall.

According to the embodiment described above, the following devices, operation methods and workpiece manufacturing methods may, of course, be further achieved.

In the following description, motion in "a direction perpendicular to a direction parallel to the surface of the catalyst body" described in [2], [4], and [6] corresponds, for example, to the "upward/downward vibration that strikes the workpiece" described above and is, in the embodiments described above, motion equivalent to the vibration that is desired to be intrinsically and directly canceled. In the embodiments described above, the "motion" means motion equivalent to the vibration in the direction along the spindles 6 (upward/downward direction).

Motion in "a component of a direction parallel to the surface of the catalyst body" described in [1], [3], and [5] is, for example, motion that causes the "upward/downward vibration that strikes the workpiece" described above. In the embodiments described above, the "motion" means motion in the direction of the reciprocating motion of one of the planarization processing sections (horizontal direction).

"An orientation that enables cancellation of the entirety or at least part of a change in a position of a center of gravity of the device" described in [1] to [6], for example, means "vibration-causing forces arising from reaction forces produced by the motion are attenuated overall" described above. In the embodiments described above regarding [1], [3], and [5], with respect to the motion of one of the planarization processing sections (planarization processing section SP1, for example), the other planarization processing section (planarization processing section SP2, for example) is caused to reciprocate in the opposite phase along the same straight line.

[1] A planarization processing device including a weight section movable in an orientation that enables cancellation of the entirety or at least part of a change in a position of a center of gravity of the device resulting from movement of at least one of a workpiece and a catalyst body having a catalyst layer at least on a surface thereof to be caused to face the workpiece from a first position at least to a second position located in an orientation containing a component of a direction parallel to the surface of the catalyst body.

[2] A planarization processing device including means configured to operate in such a way that at least one of a workpiece and a catalyst body having a catalyst layer at least on a surface thereof to be caused to face the workpiece is moved from a first position at least to a second position located in an orientation containing a component of a direction perpendicular to a direction parallel to the surface of the catalyst body, and a weight section movable in an orientation that enables cancellation of the entirety or at least part of a change in a position of a center of gravity of the device resulting from the operation of the means that performs the operation.

[3] A planarization processing device operating method including moving a weight section in an orientation that enables cancellation of the entirety or at least part of a change in a position of a center of gravity of the device resulting from movement of at least one of a workpiece and a catalyst body having a catalyst layer at least on a surface thereof to be caused to face the workpiece from a first position at least to a second position located in an orientation containing a component of a direction parallel to the surface of the catalyst body.

[4] A planarization processing device operating method including moving a weight section in an orientation that enables cancellation of the entirety or at least part of a change in a position of a center of gravity of the device resulting from movement of at least one of a workpiece and a catalyst body having a catalyst layer at least on a surface thereof to be caused to face the workpiece from a first position at least to a second position located in an orientation containing a component of a direction perpendicular to a direction parallel to the surface of the catalyst body.

[5] A workpiece manufacturing method including moving a weight section in an orientation that enables cancellation of the entirety or at least part of a change in a position of a center of gravity of a device resulting from movement of at least one of a workpiece and a catalyst body having a catalyst layer at least on a surface thereof to be caused to face the workpiece from a first position at least to a second position located in an orientation containing a component of a direction parallel to the surface of the catalyst body to perform planarization processing of the workpiece.

[6] A workpiece manufacturing method including moving a weight section in an orientation that enables cancellation of the entirety or at least part of a change in a position of a center of gravity of a device resulting from movement of at least one of a workpiece and a catalyst body having a catalyst layer at least on a surface thereof to be caused to face the workpiece from a first position at least to a second position located in an orientation containing a component of a direction perpendicular to a direction parallel to the surface of the catalyst body to perform planarization processing of the workpiece.

[7] A planarization processing device operating method including moving a weight section in an orientation that enables cancellation of the entirety or at least part of a change in a position of a center of gravity of the device resulting from movement of at least one of a workpiece and a catalyst body having a catalyst layer at least on a surface thereof to be caused to face the workpiece from a first position at least to a second position located in an orientation containing a component of a direction parallel to the surface of the catalyst body, wherein the orientation of the change in the position of the center of gravity resulting from the movement from the first position to the second position and the orientation of a change in the position of the center of gravity resulting from the movement of the weight section are located on a single straight line when viewed in a direction perpendicular to the surface of the catalyst body.

[8] The planarization processing device operating method described in [3] or [7], wherein the orientation of the movement from the first position to the second position further contains a component of the direction perpendicular to the direction parallel to the surface of the catalyst body.

[9] The planarization processing device operating method described in [3], [7] or [8], wherein the movement of the weight section is movement of at least one of a workpiece different from the workpiece and a catalyst body different from the catalyst body and having a catalyst layer at least on a surface of the other catalyst body to be caused to face the other workpiece from a third position at least to a fourth position located in an orientation containing a component of a direction parallel to the surface of the other catalyst body.

[10] A workpiece manufacturing method including moving a weight section in an orientation that enables cancellation of the entirety or at least part of a change in a position of a center of gravity of a device resulting from movement of at least one of a workpiece and a catalyst body having a catalyst layer at least on a surface thereof to be caused to face the workpiece from a first position at least to a second position located in an orientation containing a component of a direction parallel to the surface of the catalyst body to perform planarization processing of the workpiece, wherein the orientation of the change in the position of the center of gravity resulting from the movement from the first position to the second position and the orientation of a change in the position of the center of gravity resulting from the movement of the weight section are located on a single straight line when viewed in a direction perpendicular to the surface of the catalyst body.

[11] The workpiece manufacturing method described in [5] or [10], wherein the orientation of the movement from the first position to the second position further contains a component of the direction perpendicular to the direction parallel to the surface of the catalyst body.

[12] The workpiece manufacturing method described in [5], [10] or [11], wherein the movement of the weight section is movement of at least one of a workpiece different from the workpiece and a catalyst body different from the catalyst body and having a catalyst layer at least on a surface of the other catalyst body to be caused to face the other workpiece from a third position at least to a fourth position located in an orientation containing a component of a direction parallel to the surface of the other catalyst body.

[13] A planarization processing device including means for moving at least one of a workpiece and a catalyst body having a catalyst layer at least on a surface thereof to be caused to face the workpiece from a first position at least to a second position located in an orientation containing a component of a direction parallel to the surface of the catalyst body, and a weight section movable in an orientation that enables cancellation of the entirety or at least part of a change in a position of a center of gravity of the device resulting from the movement, wherein the orientation of the change in the position of the center of gravity resulting from the movement from the first position to the second position and the orientation of a change in the position of the center of gravity resulting from the movement of the weight section are located on a single straight line when viewed in a direction perpendicular to the surface of the catalyst body.

[14] The planarization processing device described in [1] or [13], wherein the orientation of the movement from the first position to the second position further contains a component of the direction perpendicular to the direction parallel to the surface of the catalyst body.

[15] The planarization processing device described in [1], [13], or [14] wherein the weight section further includes means for moving at least one of a workpiece different from the workpiece and a catalyst body different from the catalyst body and having a catalyst layer at least on a surface of the other catalyst body to be caused to face the other workpiece from a third position at least to a fourth position located in an orientation containing a component of a direction parallel to the surface of the other catalyst body.

The scope to which the present invention is applied is not limited to planarization processing using a catalyst-aided chemical processing method, as described above, and in this case, the following configurations can be employed:

[16] A planarization processing device including a planarization processing section including a first holding means that holds one of a workpiece and at least a pad, a second holding means that holds the other of the workpiece and the pad and brings the surface thereof into contact with or proximal to a surface of the one of the workpiece and the pad, and a guide member that causes the second holding means to move in a direction parallel to the other surface of the workpiece or the pad by an amount that makes possible planarization based on a catalytic reaction; at least one weight section; and a primary driver that moves the second holding means of the planarization processing section and the weight section in such a way that vibration-causing forces arising from reaction forces during movement thereof are attenuated overall.

[17] A planarization processing device including a planarization processing section including a first holding means that holds one of a workpiece and at least a pad, a first drive means that rotates the first holding means about a rotational axis that intersects the surface of the one of the workpiece and the pad, a second holding means that holds the other of the workpiece and the pad and brings the surface thereof into contact with or proximal to a surface of the one of the workpiece and the pad, and a guide member that causes the second holding means to move in a direction parallel to another surface of the workpiece or the pad by an amount that makes possible planarization based on a catalytic reaction; at least one weight section; and a primary driver that moves the second holding means of the planarization processing section and the weight section in such a way that vibration-causing forces arising from reaction forces during movement thereof are attenuated overall.

[18] A planarization processing device including a planarization processing section including a first holding means that holds one of a workpiece and at least a pad, a first drive means that rotates the first holding means about a rotational axis that intersects the surface of the one of the workpiece and the pad, a second holding means that holds the other of the workpiece and the pad and causes the surface thereof to face a surface of the one of the workpiece and the pad, a guide member that causes the second holding means to reciprocally move in a direction parallel to another surface of the workpiece or the pad by an amount that makes possible planarization based on a catalytic reaction, and a second drive means that advances the first holding means or the second holding means in the direction that intersects the surface of the workpiece or the pad to cause the surface of the workpiece and the surface of the pad to be in contact with or proximal to each other; at least one weight section; and a primary driver that moves the second holding means of the planarization processing section and the weight section in such a way that vibration-causing forces arising from reaction forces during movement thereof are attenuated overall.

[19] The planarization processing device described in any one of [16] to [18], wherein two or more of the second holding means and the weight section are arranged at intervals in a circumferential direction around a shaft body of the primary driver, and the primary driver causes the second holding means and the weight sections to simultaneously reciprocate inward and outward.

[20] The planarization processing device described in any one of [16] to [19], wherein the primary driver moves the second holding means and the weight section in a single plane in opposite phases in opposite directions.

[21] The planarization processing device described in any one of [16] to [20], wherein the primary driver moves the second holding means and the weight section along a single straight line in opposite phases in opposite directions.

[22] The planarization processing device described in any one of [16] to [21], wherein the weight section is another planarization processing section having a planarization processing function.

[23] The planarization processing device described in any one of [20] to [22], wherein the primary driver includes a drive motor and a pair of shaft sections that are provided at symmetric positions separate from each other by the same amount in a radial direction from an axis of an output shaft of the drive motor and pivotally move along with rotation of the output shaft, and the second holding means and the weight section are caused to reciprocate in synchronization with the pair of respective shaft sections.

REFERENCE SYMBOLS LIST

1: Base; 3: Linear guide (guide member); 4: Support plate (second holding means); 5: Pad (catalyst body); 71: Drive motor (first drive means); 62: Holder (first holding means); 72: Drive cylinder (second drive means); 82: Drive motor; 93, 94: Shaft section; SP1, SP2: Planarization processing section; PD: Primary driver; W: Workpiece

The invention claimed is:
1. A planarization processing system comprising:
  a first planarization processing unit that includes:
    a first holding means that holds one of a workpiece and a catalyst body having a catalyst layer at least on a surface thereof, and
    a second holding means that holds the other of the workpiece and the catalyst body and brings the surface thereof into contact with or proximal to a surface of the one of the workpiece and the catalyst body;
  a first guide, along which the second holding means is movable in a direction parallel to the other surface of the workpiece or the catalyst body at least by an amount that makes possible planarization based on a catalytic reaction;
  a primary driver that moves the second holding means along the first guide to planarize the workpiece; and
  a counterweight operably connected to the primary driver and movable by the primary driver in a manner that counteracts reaction forces produced by the movement of the second holding means in such a way that vibrations caused by the movement of the second holding means are attenuated.
2. The planarization processing system according to claim 1, wherein:
  the first planarization processing unit further includes:
    a first drive means that rotates the first holding means about a rotational axis that intersects the surface of the one of the workpiece and the catalyst body.
3. The planarization processing system according to claim 2, wherein:
  the first planarization processing unit further includes:
    a second drive means that advances the first holding means or the second holding means in the direction that intersects the surface of the workpiece or the catalyst body and causes the surface of the workpiece and the surface of the catalyst body to be in contact or in proximity with each other.
4. The planarization processing system according to claim 3, wherein two or more of the second holding means and the counterweight are arranged at intervals in a circumferential direction around a shaft body of the primary driver, and the primary driver causes the second holding means and the counterweight to simultaneously reciprocate inward and outward.
5. The planarization processing system according to claim 4, wherein the primary driver is configured to move the second holding means and the counterweight in a single plane in opposite phases in opposite directions.
6. The planarization processing system according to claim 5, wherein the primary driver reciprocally is configured to move the second holding means and the counterweight along a single straight line in opposite phases in opposite directions.
7. The planarization processing system according to claim 6, wherein the counterweight comprises a second planarization processing unit configured to perform a planarization processing function.
8. The planarization processing system according to claim 1, wherein the primary driver includes a drive motor and a pair of shaft sections that are provided at symmetric positions spaced from each other by the same amount in a radial direction from an axis of an output shaft of the drive motor and that are configured to rotationally move in accordance with rotation of the output shaft, and the second holding means and the counterweight are respectively caused to reciprocate in synchrony with the pair of shaft sections.
9. The planarization processing system according to claim 8, wherein:
  the second planarization unit comprises:
    a first holder that holds one of a second workpiece and a second catalyst body having a catalyst layer at least on a surface thereof, and
    a second holder that holds the other of the second workpiece and the second catalyst body and brings the surface thereof into contact with or proximal to a surface of the one of the second workpiece and the second catalyst body, and
  the planarization processing system further comprises:
    a second guide, along which the second holder is movable in the direction parallel to the other surface of the second workpiece or the second catalyst body at least by an amount that makes possible planarization based on a catalytic reaction.
10. The planarization processing system according to claim 9, wherein the first and second planarization units have the same weight.
11. The planarization processing system according to claim 10, wherein the first guide and the second guide each comprise:
  a pair of rails; and
  sliders that are linearly reciprocally movable along the rails, the second holding means being attached the sliders of the first guide and the second holder being attached to the sliders of the second guide.
12. The planarization processing system according to claim 11, wherein:
  the catalyst body is in the form of a pad provided on an inner bottom surface of a container adapted to store a liquid or a gas,
  the second holding means includes a support plate and the container is placed on the support plate.
13. The planarization processing system according to claim 1, wherein the first guide comprises:
  rails; and
  a pair of sliders that are linearly reciprocally movable along the rails, the second holding means being attached to the sliders.
14. The planarization processing system according to claim 1, wherein two or more of the second holding means and the counterweight are arranged at intervals in a circumferential direction around a shaft body of the primary driver, and the primary driver causes the two or more of the second holding means and the counterweight to simultaneously reciprocate inward and outward.
15. The planarization processing system according to claim 1, wherein the primary driver is configured to move the second holding means and the counterweight in a single plane in opposite phases in opposite directions.
16. The planarization processing system according to claim 1, wherein the primary driver is configured to recip- rocally move the second holding means and the counterweight along a single straight line in opposite phases in opposite directions.

17. The planarization processing system according to claim 1, wherein the counterweight comprises a second planarization processing unit configured to planarize a second workpiece.

18. A wafer planarizing system comprising:
a first planarization processing unit that includes:
   a first holder configured to hold one of a wafer and a pad having a catalyst layer, and
   a second holder configured to hold the other of the wafer and the pad,
a first guide configured to support non-rotational movement of the second holder in a direction parallel to contacting surface of the wafer and pad at least by an amount that makes possible planarization based on a catalytic reaction;
a counterweight having at least substantially the same weight as the first planarization processing unit; and
a primary driver configured to move the second holder and the counterweight such that reaction forces caused by movement of the second holder are at least substantially cancelled by opposite reaction forces caused by movement of the counterweight.

19. The wafer planarizing system according to claim 18, wherein the primary driver is configured to linearly reciprocally move the second holder and the counterweight along a single straight line in opposite phases in opposite directions.

20. The wafer planarizing system according to claim 19, wherein the counterweight is a second planarization processing unit that includes:
   a first holder configured to hold one of a second wafer and a second pad having a catalyst layer, and
   a second holder configured to hold the other of the second wafer and the second pad, and
   wherein a second guide is configured to support non-rotational movement of the second holder of the second planarization processing unit in a direction parallel to contacting surface of the second wafer and second pad at least by an amount that makes possible planarization based on a catalytic reaction.

21. The wafer planarizing system according to claim 18,
wherein the primary driver comprises a driver motor and a drive shaft configured to be rotated by the drive motor, the drive shaft having a first shaft section and a second shaft section spaced from each other by a same amount in a radial direction from an axis of the drive shaft,
wherein the second holder is connected to and moveable by the first shaft section, and
wherein the counterweight is connected to and movable by the second shaft section out of phase relative to the second holder.

* * * * *